United States Patent
Sun et al.

[11] Patent Number: 6,114,242
[45] Date of Patent: Sep. 5, 2000

[54] MOCVD MOLYBDENUM NITRIDE DIFFUSION BARRIER FOR CU METALLIZATION

[75] Inventors: Shi-Chung Sun; Hien-Tien Chiu, both of Taipei, Taiwan

[73] Assignee: Taiwan Semiconductor Manufacturing Company, Hsin-Chu, Taiwan

[21] Appl. No.: 08/985,404

[22] Filed: Dec. 5, 1997

[51] Int. Cl.$^7$ ...................................................... H01L 21/44
[52] U.S. Cl. ............................ 438/687; 427/38; 427/39; 438/624; 438/633; 438/637; 438/671; 438/680; 438/685
[58] Field of Search ...................................... 438/624, 633, 438/637, 671, 687, 685, 680; 427/38, 39

[56] References Cited

U.S. PATENT DOCUMENTS

| | | | |
|---|---|---|---|
| 4,431,708 | 2/1984 | Carver et al. | 428/641 |
| 4,603,056 | 7/1986 | MacKinnon et al. | 427/38 |
| 4,960,732 | 10/1990 | Dixit et al. | 437/192 |
| 5,646,426 | 7/1997 | Cockrum et al. | 257/188 |
| 5,817,572 | 10/1998 | Chiang et al. | 438/624 |

*Primary Examiner*—David Nelms
*Assistant Examiner*—Renée R. Berry
*Attorney, Agent, or Firm*—George O. Saile; Stephen B. Ackerman; Rosemary L. S. Pike

[57] ABSTRACT

A new method of forming a molybdenum nitride barrier layer by chemical vapor deposition from the precursor bisdiethylamido-bistertbutylimido-molybdenum (BDBTM) as a diffusion barrier for copper metallization is described. Semiconductor device structures are provided in and on a semiconductor substrate. An insulating layer is deposited overlying the semiconductor devise structures. A via opening is etched through the insulating layer to contact one of the semiconductor device structures. A barrier layer of molybdenum nitride is conformally deposited by chemical vapor deposition within the via. A layer of copper is deposited overlying the molybdenum nitride barrier layer wherein the molybdenum nitride barrier layer prevents copper diffusion to complete the copper metallization in the fabrication of an integrated circuit device.

31 Claims, 6 Drawing Sheets

MOCVD MOLYBDENUM NITRIDE DIFFUSION BARRIER FOR CU METALLIZATION

BACKGROUND OF THE INVENTION (1) Field of the Invention

The invention relates to a method of barrier layer formation in the fabrication of integrated circuits, and more particularly, to a method of forming a CVD molybdenum nitride barrier layer to prevent copper diffusion in the manufacture of integrated circuits.

(2) Description of the Prior Art

In a common application for integrated circuit fabrication, a contact/via opening is etched through an insulating layer to an underlying conductive area to which electrical contact is to be made. A barrier layer, typically titanium nitride, is formed within the contact/via opening. A conducting layer material, typically tungsten, is deposited within the contact/via opening. As device sizes continue to shrink, these typical materials are no longer adequate. Because of its lower bulk resistivity, Copper (Cu) metallization is the future technology for feature sizes of 0.18 microns and below. Cu metallization requires a good diffusion barrier to prevent the copper from diffusing through the active junctions. The inventors have found that Molybdenum nitride (MoN) is a good diffusion barrier for Cu.

U.S. Pat. No. 5,646,426 to Cockrum et al discloses a MoN film deposited by reactive sputtering under Indium. U.S. Pat. No. 4,960,732 to Dixit et al teaches a barrier layer of MoN for use with a tungsten plug. U.S. Pat. No. 4,431,708 to Carver et al teaches forming a molybdenum film and annealing it to reduce resistivity. None of the references disclose CVD MoN as a diffusion barrier for Cu.

SUMMARY OF THE INVENTION

A principal object of the present invention is to provide an effective and very manufacturable method of forming a molybdenum nitride barrier layer in a copper metallization process in the fabrication of integrated circuit devices.

Another object of the invention is to provide a method for forming a molybdenum nitride barrier layer that will prevent copper from diffusing into active junctions.

A further object of the invention is to provide a method for forming a molybdenum nitride barrier layer by chemical vapor deposition.

A still further object of the invention is to provide a new precursor, bisdiethylamido-bistertbutylimido-molybdenum (BDBTM) for chemical vapor deposition of molybdenum nitride.

Yet another object of the invention is to provide a method for forming a molybdenum nitride barrier layer by chemical vapor deposition from the precursor bisdiethylamido-bistertbutylimido-molybdenum (BDBTM).

Yet another object of the invention is to provide a method for forming a molybdenum nitride barrier layer by chemical vapor deposition from the precursor bisdiethylamido-bistertbutylimido-molybdenum (BDBTM) as a diffusion barrier for copper metallization.

In accordance with the objects of this invention a new method of forming a molybdenum nitride barrier layer by chemical vapor deposition from the precursor bisdiethylamido-bistertbutylimido-molybdenum (BDBTM) as a diffusion barrier for copper metallization is achieved. Semiconductor device structures are provided in and on a semiconductor substrate. An insulating layer is deposited overlying the semiconductor device structures. A via opening is etched through the insulating layer to contact one of the semiconductor device structures. A barrier layer of molybdenum nitride is conformally deposited by chemical vapor deposition within the via. A layer of copper is deposited overlying the molybdenum nitride barrier layer wherein the molybdenum nitride barrier layer prevents copper diffusion to complete the copper metallization in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

Figure 1:
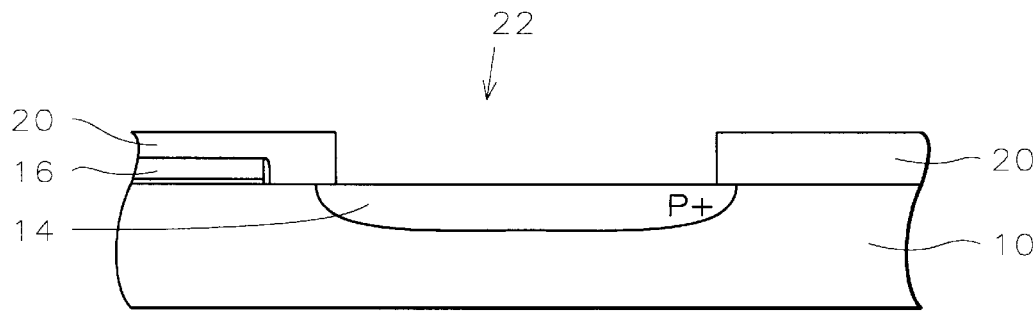
FIGS. 1, 2, 4 and 5 schematically illustrate in cross-sectional representation a preferred embodiment of the present invention.

Referring now more particularly to FIG. 1, there is illustrated a portion of a partially completed integrated circuit device. There is shown a semiconductor substrate 10, preferably composed of monocrystalline silicon. Semiconductor devices structures are formed in and on the semiconductor substrate. For example, a gate electrode 16 and a source/drain region 14 are illustrated in FIG. 1. Source/drain region 14 is a P+region in the illustration. It is well understand by those skilled in the art that this could be an N+region as well. It should be understood that the invention is not limited to the embodiment illustrated in the drawing figures, but is applicable to any application in which copper metallization is used.

An insulating layer 20, composed of silicon dioxide, borophosphosilicate glass (BPSG), borosilicate glass (BSG), phosphosilicate glass (PSG), or the like, is deposited over the surface of the semiconductor structures to a thickness of between about 5000 to 9000 Angstroms and preferably planarized.

Figure 2:
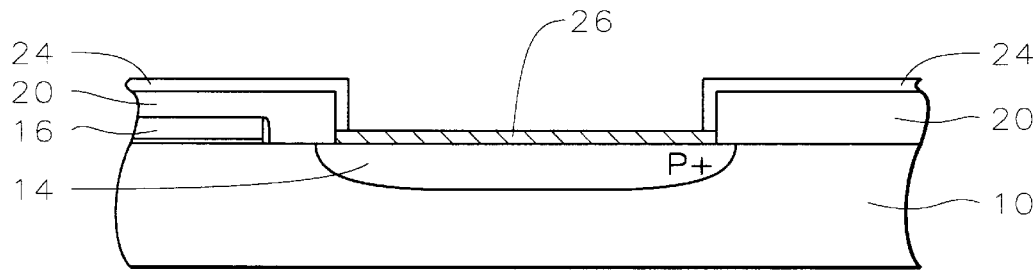

A contact/via opening 22 is etched through the insulating layer 20 to the source/drain region 14 within the semiconductor substrate. A glue layer 24, such as titanium, is deposited over the insulating layer and within the via opening to a thickness of about 200 Angstroms. After subsequent heat treatment, the titanium will react with the underlying silicon within the via opening to form titanium silicide 26 which will reduce contact resistance. The glue layer is shown in FIG. 2.

The inventors have discovered that molybdenum nitride (MoN) can withstand Cu diffusion up to 550° C. post processing temperature for 30 minutes. This is at least as effective or better than CVD titanium nitride. MoN deposited by metal organic chemical vapor deposition (MOCVD)

has better step coverage than MoN deposited by physical vapor deposition (PVD). The inventors have developed a new precursor for depositing MoN by MOCVD.

Figure 3:
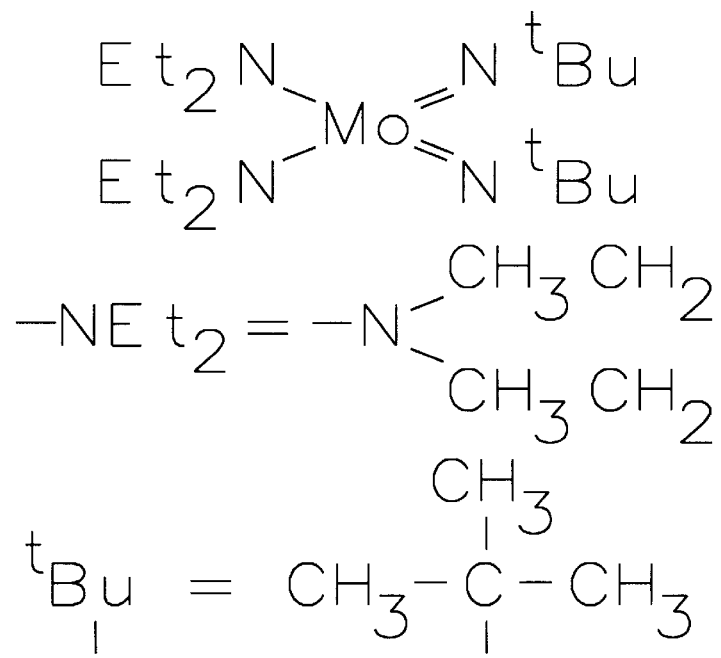
FIG. 3 illustrates the molecular structure of the bisdiethylamido-bistertbutylimido-molybdenum (BDBTM) precursor of the present invention.

The new precursor, bisdiethylamido-bistertbutylimido-molybdenum (BDBTM), a dark-yellow compound at room temperature, has the molecular structure Mo ($^t$BuN)$_2$ (NE$_{t2}$)$_2$, illustrated in FIG. 3. The strong Mo=N double bond preserves the MoN portion of the precursor and results in a cubic phase MoN film during the pyrolysis process. The cubic phase has lower resistivity than other phases.

Figure 4:
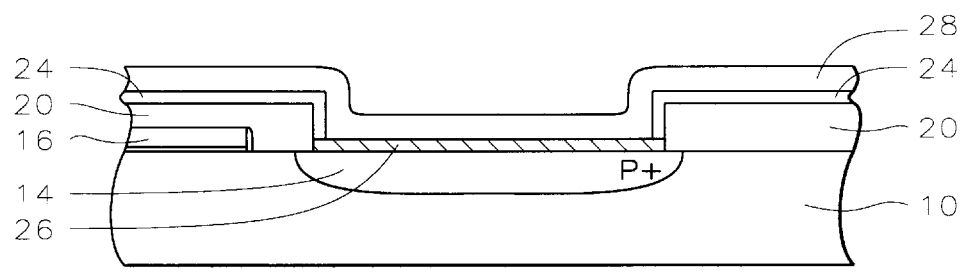

Using the precursor BDBTM, a MoN layer 28 is deposited by MOCVD within the contact/via opening. The precursor BDBTM is flowed at a rate of between about 20 to 40 sccm using argon as a carrier gas at a temperature of between about 450 and 600° C. and pressure of 0.2 to 0.4 Torr. The MoN layer 28 is deposited to a thickness of between about 200 and 600 Angstroms This layer 28 forms a barrier layer, as illustrated in FIG. 4.

The MOCVD process of the invention uses a low deposition temperature of between about 450 to 600° C. for good conformality. In order to lower resistivity at this low deposition temperature, a post-treatment of the MoN film is implemented.

There are two alternative approaches to the MoN post-treatment. In the first approach, after the MoN layer has been deposited to its desired thickness, the wafer is exposed to NH$_a$ gas at a temperature of 450 to 650° C. for about 30 minutes. In the second approach, 100 Angstroms of MoN is deposited, for example at 450° C., as the barrier layer 28. Then the wafer is exposed to a 50 watt N$_2$ plasma treatment at 650° C. for 30 minutes. Another 100 Angstroms of MoN is deposited, followed by another N$_2$ plasma treatment. The sequence of MoN deposition and N$_2$ plasma treatment is repeated until the desired MoN thickness of the barrier layer 28 is achieved.

Figure 5:
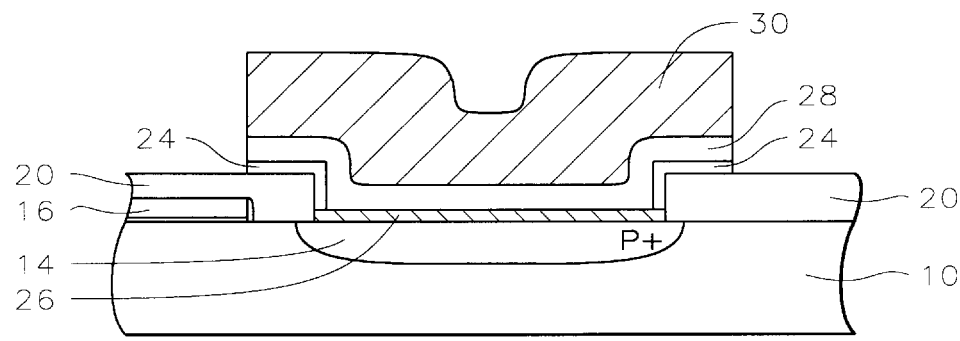

Referring now to FIG. 5, a layer of copper 30, is sputter deposited over the barrier layer 28 to fill the contact/via opening. The copper layer and the barrier layer are patterned to form the desired electrical contact.

Figure 6A:
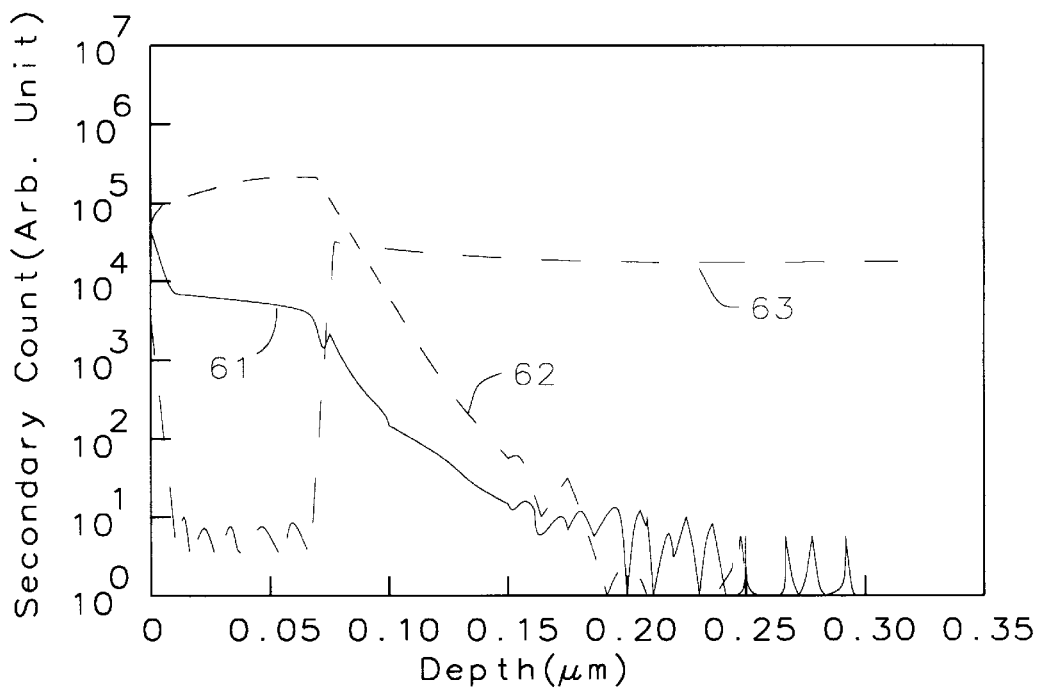
FIGS. 6A and 6B graphically illustrate SIMS depth profiles of the Cu/MoN/Si structure of the present invention.
Figure 6B:
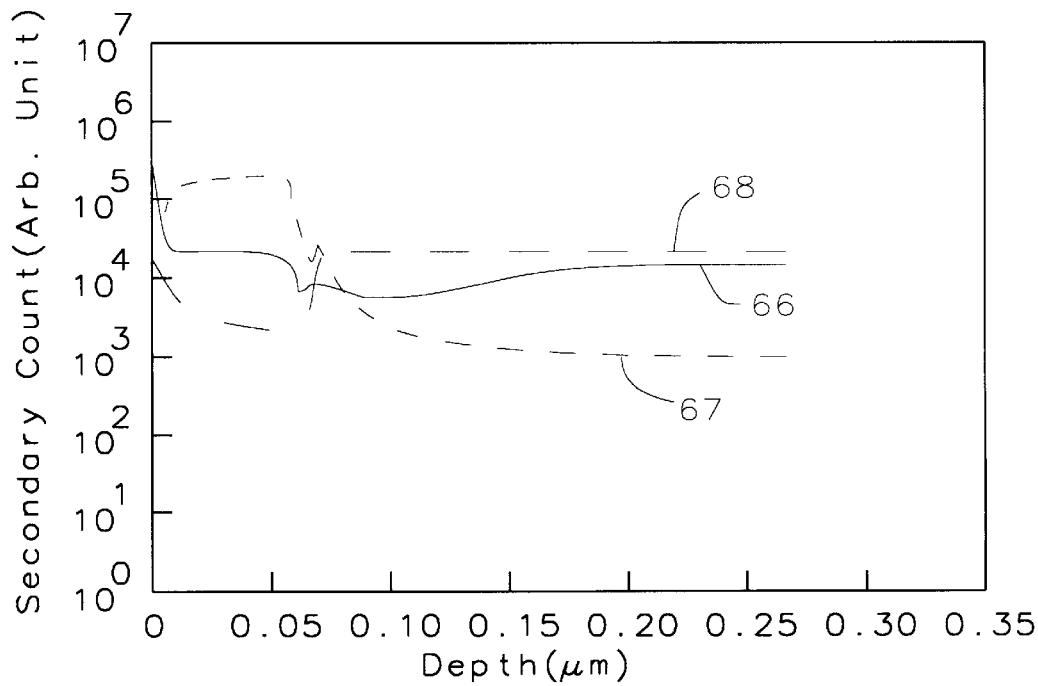

FIGS. 6A and 6B illustrate the barrier property of 600 Angstroms of CVD MoN against copper diffusion, using SIMS Analysis. FIG. 6A illustrates the depth profile of copper (line 61), MoN (line 62), and silicon (line 63) after annealing at 550° C. for 30 minutes. The annealing was performed to simulate thermal processing subsequent to the copper deposition. FIG. 6B illustrates the depth profile of copper (line 66), MoN (line 67), and silicon (line 68) after annealing at 600° C. for 30 minutes. It can be seen that at post processing temperatures of 600° C., the copper penetrated into the silicon by diffusing through the MoN barrier, but at post processing temperatures of 550° C., the MoN barrier held against Cu diffusion.

Figure 7A:
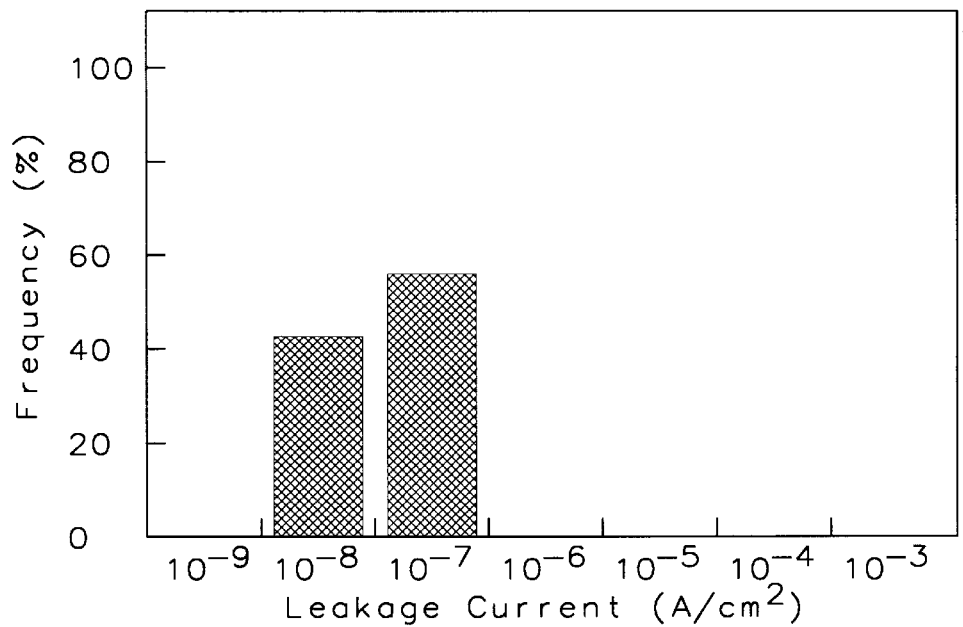
FIGS. 7A and 7B graphically illustrate leakage current density distributions of the Cu/MoN/Si p+n junction structure of the present invention.
Figure 7B:
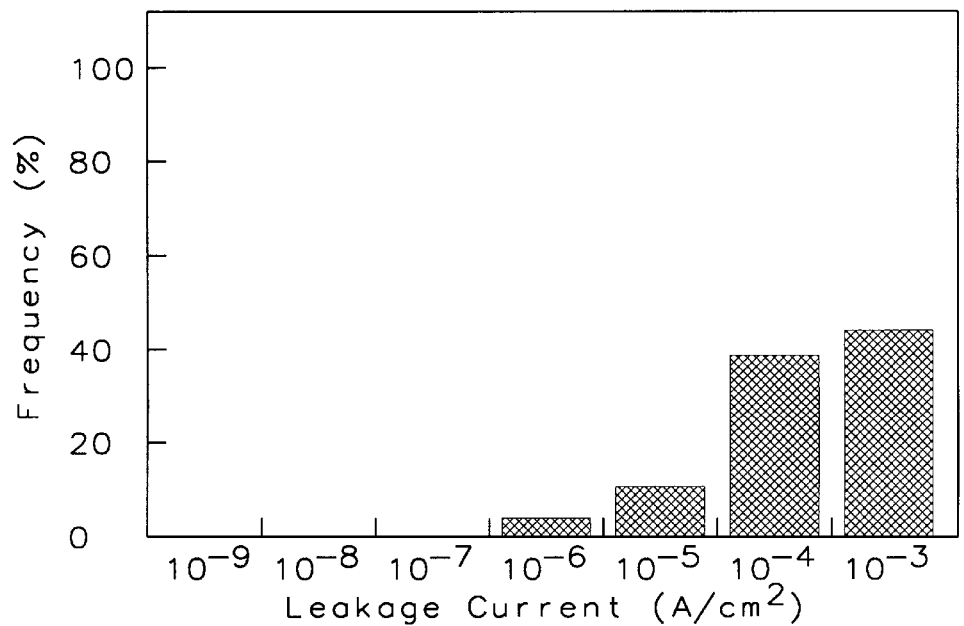

FIGS. 7A and 7B illustrate the p+n junction diode measurements. The leakage current density distributions are shown, in FIG. 7A, after annealing at 550° C. for 30 minutes, and in FIG. 7B, after annealing at 600° C. for 30 minutes. The leakage current in FIG. 7B is too high, but the leakage current in FIG. 7A is acceptable. This indicates that MoN can withstand Cu diffusion at post-processing temperatures of up to 550° C. for 30 minutes.

Figure 8:
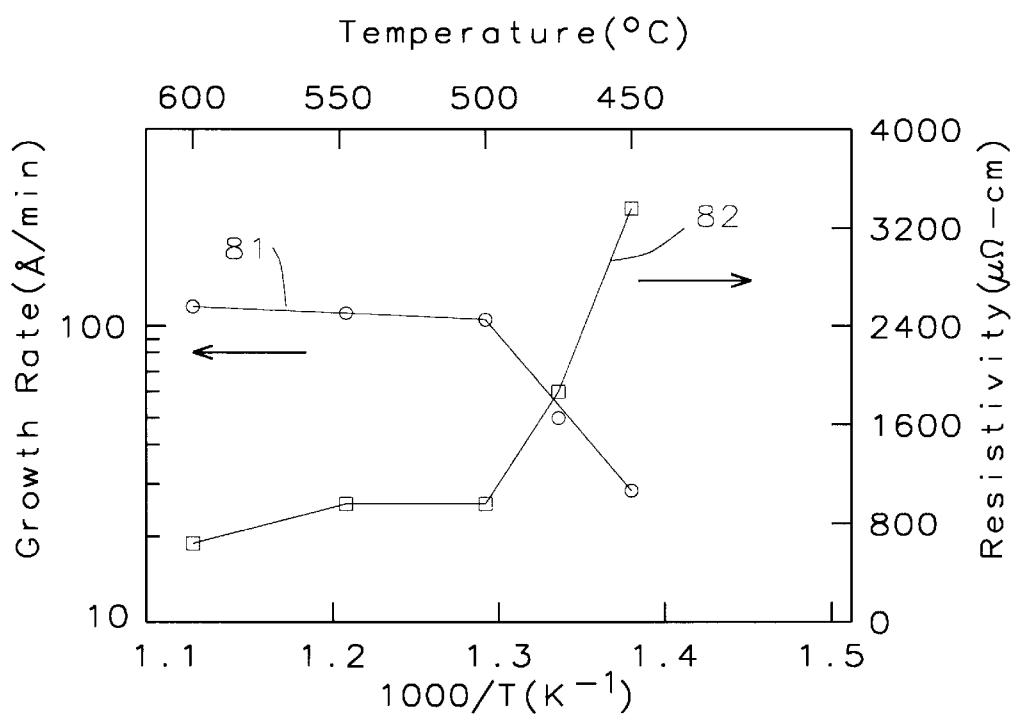
FIG. 8 graphically illustrates growth rate and resistivity of a MoN film as a function of deposition temperature.

FIG. 8 illustrates the growth kinetics and film resistivity of the MoN film. Line 81 shows the growth rate of the MoN film at different temperatures. Growth rate is higher at higher temperatures. Line 82 shows that the resistivity of the film is lower at higher temperatures. However, higher temperature deposition results in decreased conformality of the film. This is a known problem for CVD titanium nitride as well.

Figure 9A:
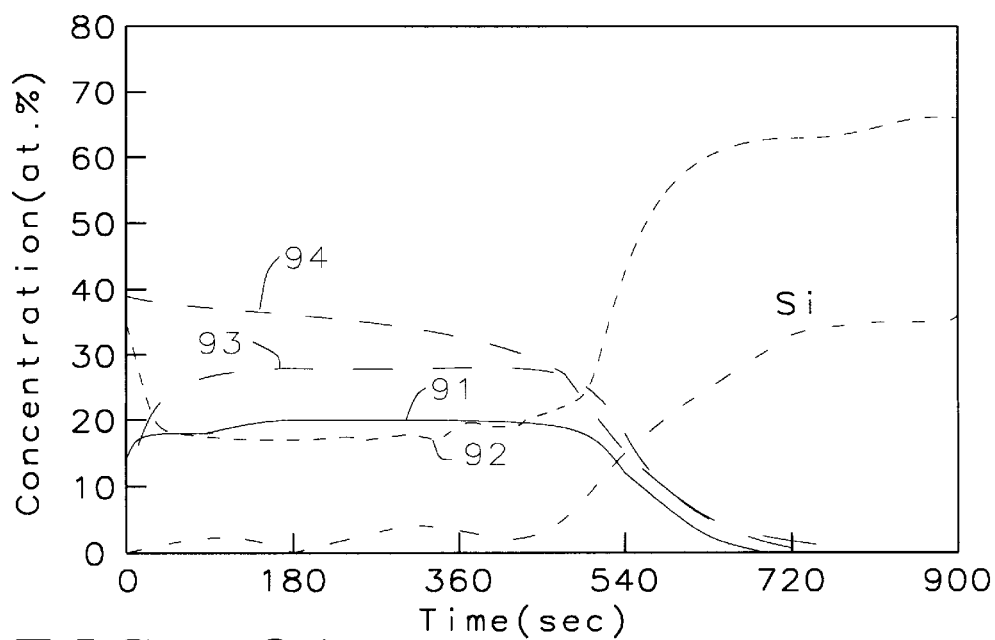
FIGS. 9A, 9B, and 9C graphically illustrate Auger depth profiles of the Cu/MoN/Si structure of the present invention.
Figure 9B:
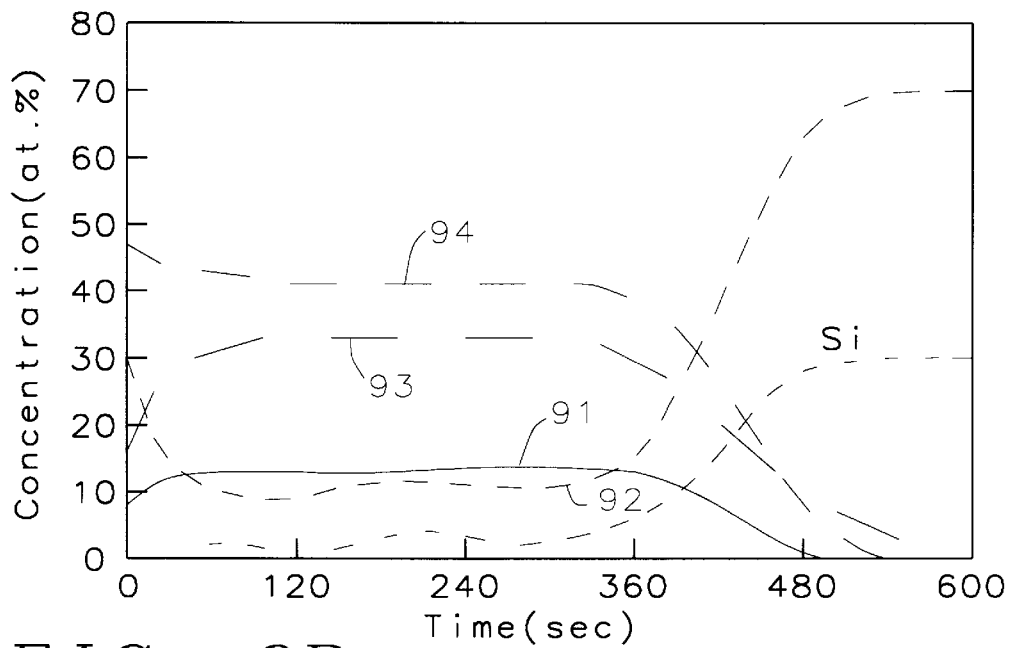
Figure 9C:
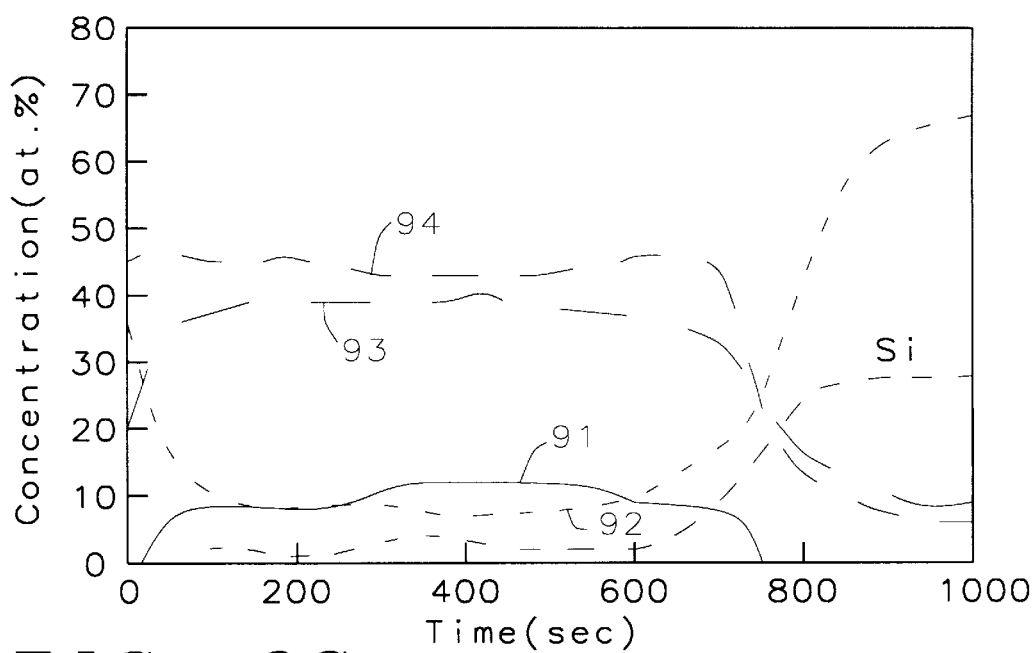

FIGS. 9A, 9B, and 9C illustrate the effects of the MoN post-treatment. These figures illustrate the Auger depth profiles of the CVD MoN film deposited at 450° C. FIG. 9A illustrates the concentrations of the elements of the film after deposition. High concentrations of carbon 91 and oxygen 92 relative to molybdenum 93 and nitrogen 94 result in high resistivity. FIG. 9B illustrates the Auger depth profiles after the 30 minute NH$_3$ treatment of the invention. It can be seen that carbon 91 and oxygen 92 concentrations are reduced, thereby reducing resistance. FIG. 9C illustrates the Auger depth profiles after the 30 minute N$_2$ plasma treatment of the invention. The carbon 91 and oxygen 92 concentrations have been reduced further, resulting in decreased resistance.

The process of the invention results in an effective and very manufacturable MoN diffusion barrier for copper metallization. The new BDBTM precursor of the invention for MOCVD of MoN provides a high quality MoN film with good step coverage.

While the invention has been particularly shown and described with reference to the preferred embodiments thereof, it will be understood by those skilled in the art that various changes in form and details may be made without departing from the spirit and scope of the invention.

What is claimed is:

1. A method of copper metallization in the fabrication of an integrated circuit device comprising:

providing semiconductor device structures in and on a semiconductor substrate;

covering said semiconductor device structures with an insulating layer;

opening a via through said insulating layer to one of said underlying semiconductor device structures;

conformally depositing a barrier layer of molybdenum nitride within said via; and depositing a layer of copper overlying said molybdenum nitride barrier layer to complete said copper metallization in the fabrication of said integrated circuit device.

2. The method according to claim 1 wherein said semiconductor device structures include gate electrodes and associated source and drain regions.

3. The method according to claim 1 further comprising depositing a titanium glue layer underlying said molybdenum barrier layer.

4. The method according to claim 1 wherein said molybdenum nitride barrier layer is deposited by chemical vapor deposition.

5. The method according to claim 1 wherein said molybdenum nitride barrier layer is deposited by chemical vapor deposition using the precursor bisdiethylamido-bistertbutylimido-molybdenum (BDBTM).

6. The method according to claim 5 wherein said molybdenum nitride barrier layer is deposited at a temperature of between about 450 and 600° C. to a thickness of between about 200 and 600 Angstroms.

7. The method according to claim 1 wherein said molybdenum nitride barrier layer prevents copper diffusion at a post-processing temperature of up to 550° C. for 30 minutes.

8. The method according to claim 1 further comprising:

treating said molybdenum nitride barrier layer with NH$_3$ for 30 minutes to lower resistivity of said integrated circuit device.

9. The method according to claim 1 further comprising:

treating said molybdenum nitride barrier layer wiht N$_2$ plasma for 30 minutes to lower resistivity of said integrated circuit device.

10. The method according to claim 1 wherein said step of depositing said molybdenum nitride barrier layer comprises:

(a) depositing 100 Angstroms of molybdenum nitride within said via;

(b) thereafter treating said molybdenum nitride with N$_2$ plasma for 30 minutes; and (c) repeating said steps (a) and (b) until a desired thickness of said molybdenum nitride barrier layer is achieved.

11. A method of forming a molybdenum nitride film by chemical vapor deposition comprising:

flowing a gaseous compound of the formula Mo ($^t$BuN)$_2$ (NEt$_2$)$_2$ in a deposition chamber at 20 to 40 sccm at a temperature of between about 450 to 600° C. and a pressure of 0.2 to 0.4 Torr to form said molybdenum nitride film.

12. The method according to claim 11 wherein an argon gas is used as a carrier for said gaseous compound.

13. A method of copper metallization in the fabrication of an integrated circuit device comprising:

providing semiconductor device structures in and on a semiconductor substrate;

covering said semiconductor device structures with an insulating layer;

opening a via through said insulating layer to one of said underlying semiconductor device structures;

depositing a glue layer within said via;

conformally depositing by chemical vapor deposition a barrier layer of molybdenum nitride overlying said glue layer; and depositing a layer of copper overlying said molybdenum nitride barrier layer to complete said copper metallization in the fabrication of said integrated circuit device.

14. The method according to claim 13 wherein said semiconductor device structures include gate electrodes and associated source and drain regions.

15. The method according to claim 13 wherein said glue layer comprises titanium having a thickness of about 200 Angstroms.

16. The method according to claim 13 wherein said molybdenum nitride barrier layer is deposited by chemical vapor deposition using the precursor bisdiethylamido-bistertbutylimido-molybdenum (BDBTM).

17. The method according to claim 13 wherein said molybdenum nitride barrier layer is deposited at a temperature of between about 450 and 600° C. to a thickness of between about 200 and 600 Angstroms.

18. The method according to claim 13 wherein said molybdenum nitride barrier layer prevents copper diffusion at a post-processing temperature of up to 550° C. for 30 minutes.

19. The method according to claim 13 further comprising:

treating said molybdenum nitride barrier layer with NH$_3$ for 30 minutes to lower resistivity of said integrated circuit device.

20. The method according to claim 13 further comprising:

treating said molybdenum nitride barrier layer with N$_2$ plasma for 30 minutes to lower resistivity of said integrated circuit device.

21. The method according to claim 13 wherein said step of depositing said molybdenum nitride barrier layer comprises:

(a) depositing 100 Angstroms of molybdenum nitride within said via;

(b) thereafter treating said molybdenum nitride with N$_2$ plasma for 30 minutes; and (c) repeating said steps (a) and (b) until a desired thickness of said molybdenum nitride barrier layer is achieved.

22. A method of copper metallization in the fabrication of an integrated circuit device comprising:

providing semiconductor device structures in and on a semiconductor substrate;

covering said semiconductor device structures with an insulating layer;

opening a via through said insulating layer to one of said underlying semiconductor device structures;

conformally depositing by chemical vapor deposition a barrier layer of molybdenum nitride within said via;

treating said molybdenum nitride barrier layer with NH$_3$ for 30 minutes; and thereafter depositing a layer of copper overlying said molybdenum nitride barrier layer wherein said molybdenum nitride barrier layer prevents copper diffusion to complete said copper metallization in the fabrication of said integrated circuit device.

23. The method according to claim 22 wherein said semiconductor device structures include gate electrodes and associated source and drain regions.

24. The method according to claim 22 wherein said molybdenum nitride barrier layer is deposited by chemical vapor deposition using the precursor bisdiethylamido-bistertbutylimido-molybdenum (BDBTM).

25. The method according to claim 22 wherein said molybdenum nitride barrier layer is deposited at a temperature of between about 450 and 600° C. to a thickness of between about 200 and 600 Angstroms.

26. The method according to claim 22 wherein said molybdenum nitride barrier layer prevents copper diffusion at a post-processing temperature of up to 550° C. for 30 minutes.

27. A method of copper metallization in the fabrication of an integrated circuit device comprising:

providing semiconductor device structures in and on a semiconductor substrate;

covering said semiconductor device structures with an insulating layer;

opening a via through said insulating layer to one of said underlying semiconductor device structures;

repeating the steps of:

(a) conformally depositing by chemical vapor deposition a barrier layer of molybdenum nitride within said via; and (b) treating said molybdenum nitride barrier layer with N$_2$ plasma for 30 minutes;

until said molybdenum nitride barrier layer has a thickness of between about 200 and 600 Angstroms; and thereafter depositing a layer of copper overlying said molybdenum nitride barrier layer wherein said molybdenum nitride barrier layer prevents copper diffusion to complete said copper metallization in the fabrication of said integrated circuit device.

28. The method according to claim 27 wherein said semiconductor device structures include gate electrodes and associated source and drain regions.

29. The method according to claim 27 wherein said molybdenum nitride barrier layer is deposited by chemical vapor deposition using the precursor bisdiethylamido-bistertbutylimido-molybdenum (BDBTM).

30. The method according to claim 27 wherein said molybdenum nitride barrier layer is deposited at a temperature of between about 450 and 600° C.

31. The method according to claim 27 wherein said molybdenum nitride barrier layer prevents copper diffusion at a post-processing temperature of up to 550° C. for 30 minutes.

* * * * *